US008754499B1

(12) United States Patent
Erickson et al.

(10) Patent No.: US 8,754,499 B1
(45) Date of Patent: Jun. 17, 2014

(54) SEMICONDUCTOR CHIP WITH POWER GATING THROUGH SILICON VIAS

(71) Applicant: International Business Machines Corporation, Armonk, NY (US)

(72) Inventors: Karl R. Erickson, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/803,949

(22) Filed: Mar. 14, 2013

(51) Int. Cl.
*H01L 23/525* (2006.01)
*H01L 27/112* (2006.01)
*H01L 27/115* (2006.01)

(52) U.S. Cl.
CPC ..... *H01L 27/11206* (2013.01); *H01L 27/11273* (2013.01); *H01L 27/11509* (2013.01)
USPC ........................................ 257/530

(58) Field of Classification Search
CPC .................. H01L 27/11509; H01L 27/11206; H01L 27/11273
USPC .......... 257/530, 531, 774, 529; 438/131, 467, 438/600, 957
See application file for complete search history.

(56) References Cited

U.S. PATENT DOCUMENTS

| | | | | |
|---|---|---|---|---|
| 5,369,054 A * | 11/1994 | Yen et al. | ........... | 438/600 |
| 5,602,053 A * | 2/1997 | Zheng et al. | ........... | 438/600 |
| 6,664,639 B2 * | 12/2003 | Cleeves | ........... | 257/774 |
| 6,969,892 B2 * | 11/2005 | Matsumoto | ........... | 257/355 |
| 7,015,823 B1 * | 3/2006 | Gillen et al. | ........... | 340/652 |
| 7,474,000 B2 * | 1/2009 | Scheuerlein et al. | ........... | 257/758 |
| 7,573,117 B2 * | 8/2009 | Chinthakindi et al. | ........... | 257/528 |
| 7,607,586 B2 * | 10/2009 | Wang | ........... | 235/492 |
| 7,930,664 B2 | 4/2011 | Feng et al. | | |

(Continued)

FOREIGN PATENT DOCUMENTS

JP         08255837 A      1/1996

OTHER PUBLICATIONS

Erickson et al., "Semiconductor Chip with Power Gating Through Silicon Vias", filed Mar. 14, 2013, U.S. Appl. No. 13/803,895.

*Primary Examiner* — Nathan Ha
(74) *Attorney, Agent, or Firm* — Chad J. Hammerlind; Robert R. Williams

(57) ABSTRACT

A semiconductor chip includes a semiconductor on insulator structure having a frontside and a backside. The chip includes a circuit in the semiconductor layer at the frontside. The circuit is isolated from a substrate. The chip includes a through silicon via (TSV) having a front-end, a back-end, and a lateral surface. The TSV is in the semiconductor layer and buried oxide layer and the front-end surface of the TSV is substantially parallel to the frontside of the semiconductor layer. An antifuse is deposited between the back-end of the TSV and the substrate. The antifuse insulates the TSV from the substrate. A ground layer is insulated from the semiconductor on insulator structure, and is coupled with the TSV and the circuit. The ground layer conducts a program voltage to the TSV to cause a portion the antifuse to migrate away from the TSV, thereby connecting the circuit to the ground.

20 Claims, 16 Drawing Sheets

(56) References Cited

U.S. PATENT DOCUMENTS

| | | |
|---|---|---|
| 8,125,048 B2 | 2/2012 | Kane et al. |
| 8,211,756 B2 | 7/2012 | Feng et al. |
| 2003/0209809 A1 | 11/2003 | Lasky et al. |
| 2007/0176625 A1 | 8/2007 | Hayashi et al. |
| 2010/0320565 A1 | 12/2010 | Chen et al. |
| 2012/0112312 A1 | 5/2012 | Perry et al. |
| 2012/0223738 A1 | 9/2012 | Or-Bach et al. |
| 2012/0261795 A1* | 10/2012 | Basker et al. .................. 257/530 |

* cited by examiner

SEMICONDUCTOR CHIP WITH POWER GATING THROUGH SILICON VIAS

FIELD

The present invention relates generally to semiconductor chips, and more particularly relates to power gating with through silicon vias (TSV).

BACKGROUND

Integrated circuits (ICs) have become ubiquitous. Cell phones, PDAs, cameras, medical devices, laptops, and many other devices include ICs. A typical IC includes several types of semiconductor devices, such as transistors. In modern ICs, transistors may be used to implement logic or memory functions. Typically, ICs have been planar in design. Planar semiconductor chip designs limit the amount of circuitry that may be placed on a single IC die.

To overcome some of the limitations of planar ICs, designers began stacking chips vertically to form three-dimensional designs. A three-dimensional (3D) IC, therefore, is a semiconductor assembly in which two or more planar layers of active electronic components are integrated both vertically and horizontally into a single device. These three-dimensional structures increase the density of active circuits.

SUMMARY

One embodiment is directed to a semiconductor chip and a method of making the same having power gating capabilities. The semiconductor chip includes a semiconductor on insulator structure having a frontside surface and a backside surface. The semiconductor on insulator structure includes a semiconductor substrate with the backside surface coupled to a ground formed by, a semiconductor layer with the frontside surface, and a buried oxide layer between the semiconductor substrate and the semiconductor layer. The semiconductor chip further includes a functional circuit in the semiconductor layer at the frontside surface. The functional circuit is electrically isolated from the semiconductor substrate. The chip includes a through silicon via (TSV) having a front-end surface, a back-end surface, and a lateral surface. The TSV is in the semiconductor layer and buried oxide layer. The front-end surface of the TSV is substantially parallel to the frontside surface of the semiconductor layer. Also, an antifuse material is deposited between the back-end surface of the TSV and the semiconductor substrate. The antifuse material is configured to insulate the TSV from the semiconductor substrate. A functional ground layer is insulated from the semiconductor on insulator structure, and electrically coupled with the TSV and the functional circuit. The functional ground layer is configured to conduct a program voltage to the TSV to cause a portion the antifuse material to migrate away from the TSV, thereby electrically connecting the functional circuit to the ground.

In another embodiment, a method of power gating a semiconductor chip is described. The method includes providing the semiconductor chip described above. It may be determined whether the functional circuits of the semiconductor chip are functional. If the functional circuits are functional, then blow the antifuse material with a program voltage to ground the functional circuit to the substrate ground.

DETAILED DESCRIPTION

Figure 1:
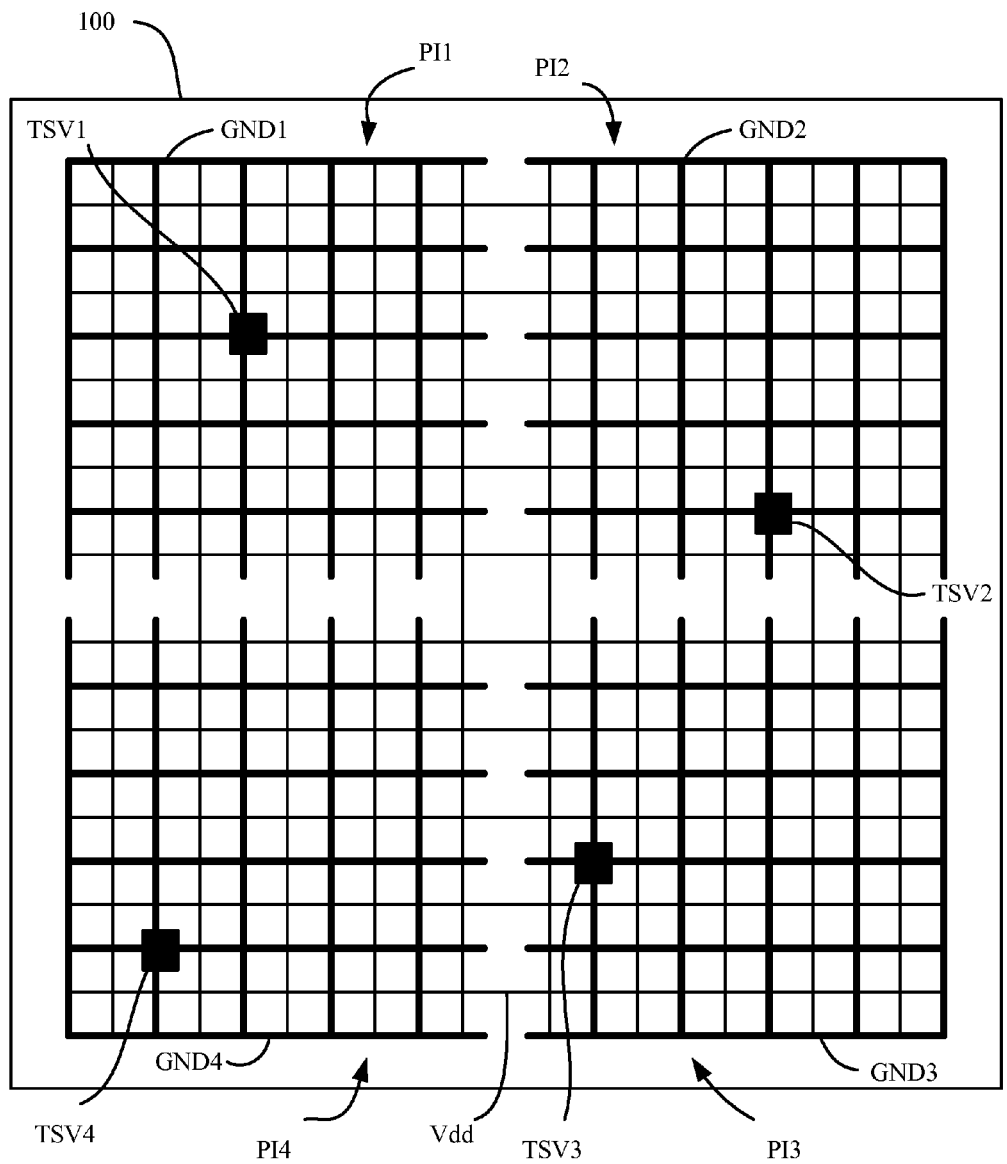
FIG. 1 is a top view of a semiconductor chip with a plurality of power islands with power gating capabilities, according to an embodiment.

Embodiments herein provide for a power gated semiconductor chip using through silicon vias (TSV) and a method of making and using the same. Features illustrated in the drawings are not necessarily drawn to scale. Descriptions of well-known components and processing techniques are omitted so as to not unnecessarily obscure the disclosed embodiments. The descriptions of embodiments are provided by way of example only, and are not intended to limit the scope of the disclosure. The same numbers may be used in the Figures and the Detailed Description to refer to the same devices, parts, components, steps, operations, and the like.

Power and performance requirements on semiconductor chips have been addressed in various ways including power islands and gating power using switched transistors. However, switched transistors consume a large area of the semiconductor chip. The transistors may also experience an IR-drop when on or active and may experience leakage when off or inactive. Some advantages of embodiments described herein may include reduced chip area consumption and improved power gating. This may be done by replacing switched transistors with one or more programmable TSVs used as antifuses to selectively couple a functional ground layer of a semiconductor chip to a grounded semiconductor substrate of the chip when the programmable TSV is blown. An antifuse is opposite of a fuse in that it acts as a short circuit when blown and acts as an open circuit when not blown. The functional ground layer is coupled with a functional circuit and coupling the functional ground layer to the grounded semiconductor substrate allows power to be provided to the functional circuit.

Referring now to FIG. 1, a top view of a semiconductor chip 100 is illustrated, according to an embodiment. The semiconductor chip 100 may include one or more power islands. In FIG. 1, four power islands PI1, PI2, PI3, and PI4 are illustrated. Each power island may include a functional circuit (not depicted in FIG. 1), such as processors, arrays, and L2 cache, for example. Each power island PI1-PI4 may include a respective independent functional ground layer GND1, GND2, GND3, and GND4. Each functional ground layer GND1, GND2, GND3, and GND4 may be coupled with a respective functional circuit. The ground layers GND1-GND4 may be electrically isolated from each other. Each power island PI1-PI4 may have a power supply layer (Vdd layer) that may be electrically connected to each other. The power islands PI1-PI4 may also have a respective TSV (TSV1, TSV2, TSV3, and TSV4).

As illustrated and discussed further below when referring to FIG. 2 through FIG. 13, the TSVs may couple to the functional ground layer on a front-end surface (top side) of the TSV, and the TSV may be adjacent to a semiconductor substrate on the back-end surface of the TSV. The semiconductor substrate of the semiconductor chip 100 may have a backside connection to ground. The TSVs may have an antifuse material, such as an oxide, insulating the TSV from the semiconductor substrate. The antifuse material may be configured to selectively blow in an antifuse fashion, allowing the functional ground layer to be in electrically coupled to the grounded semiconductor substrate. A blow operation may be accomplished by creating a relatively high voltage differential between the TSV and the grounded semiconductor substrate. The high voltage differential may drive away the semiconductor material between the ground semiconductor substrate and the TSV. If a TSV of a power island is selected to be blown, then functional circuits of the power island may operate as they now have the full voltage rail available.

Figure 2:
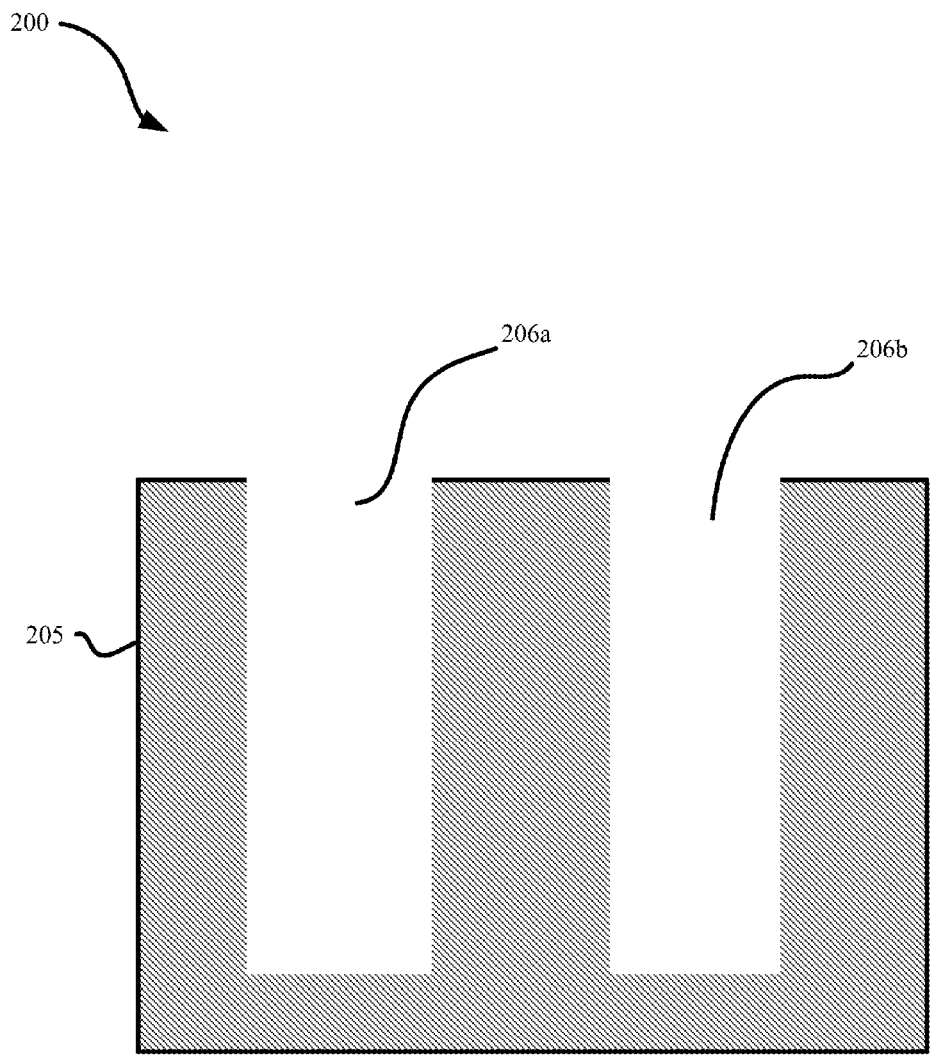
FIGS. 2-5 are sequential vertical cross-sectional views of manufacturing steps of a semiconductor chip with a bulk semiconductor structure, according to an embodiment.

Referring now to FIG. 2, vertical cross-sectional view of an etched bulk semiconductor substrate 205 is illustrated according to an embodiment. The bulk semiconductor substrate 205 may be selectively etched to a suitable depth, patterned for one or more TSVs. The selective etching may form etched openings 206a and 206b, generally referred to as 206. The etched bulk semiconductor substrate 205 may be referred to as semiconductor structure 200. The bulk semiconductor substrate 205 may be single crystal silicon. However, the semiconductor substrate 205 may include other appropriate semiconducting materials, including, but not limited to, SiC, Ge alloys, GaP, InAs, InP, SiGe, GaAs, other III/V or II-VI compound semiconductors, or other crystalline structures. The etched openings 206 for the TSVs may be etched 20-55 µm deep in the semiconductor substrate 205 in one embodiment; however other depths may be considered. Also, the etched openings 206 may typically have a diameter of 20-30 µm, but again, other diameter dimensions may be considered. The etched openings 206 may be cylindrical in shape; however other shapes may be considered.

Figure 3:
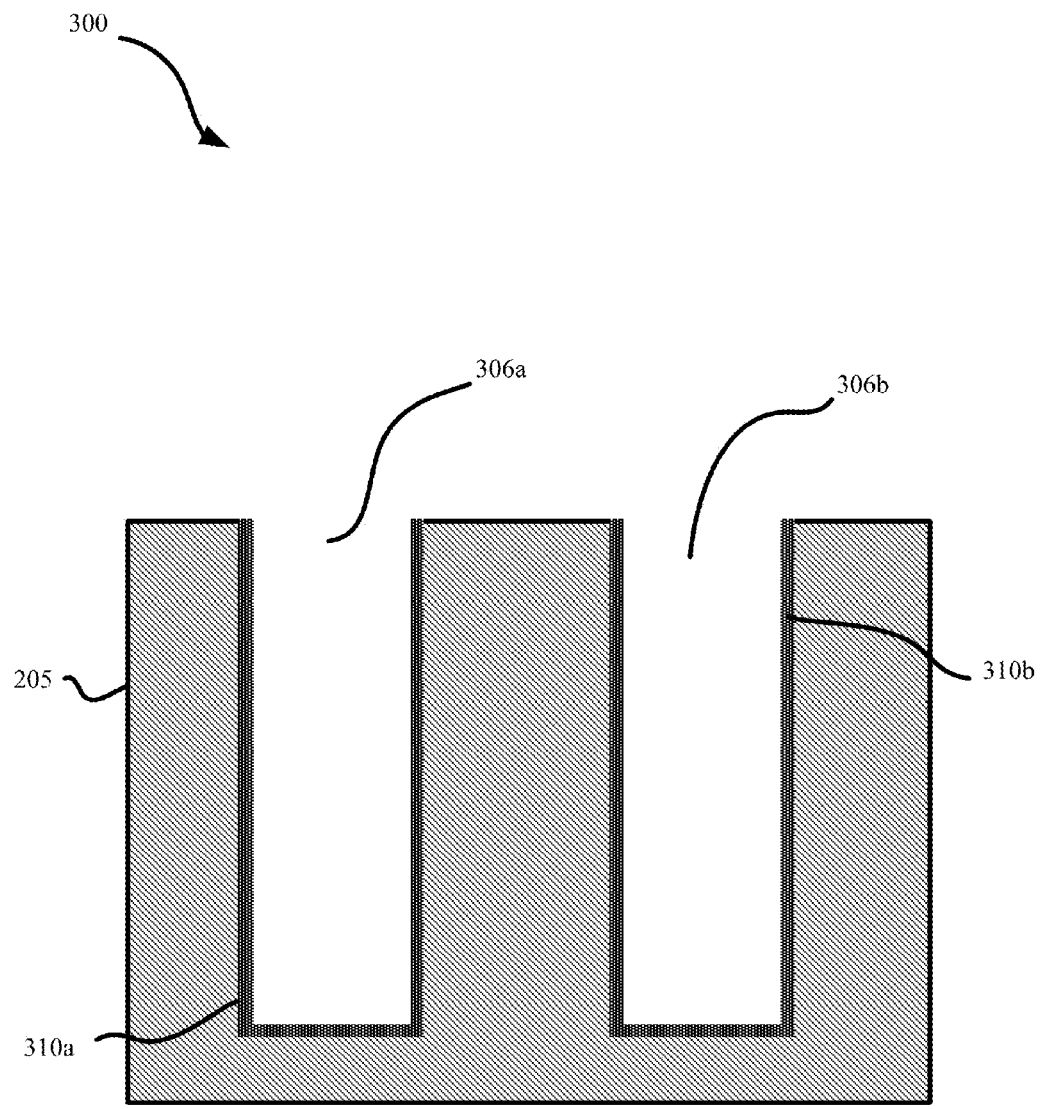

Referring now to FIG. 3, a vertical cross-sectional view after a manufacturing step of the semiconductor structure 200 of FIG. 2 is illustrated, according to an embodiment. An antifuse material 310a and 310b, referred generally herein as antifuse material 310, may be added to the exposed surfaces of the semiconductor substrate 205 formed by the etched openings 206 forming etched openings 306a and 306b, generally referred as etched openings 306. The antifuse material 310 may be any suitable material that may behave as an antifuse when a voltage differential is placed across it. An antifuse material 310 may be $HfO_2$, for example. The thickness of the antifuse material 310 may be 12-15 Å, for example. The semiconductor structure 200 is now referred to as semiconductor structure 300.

Figure 4:
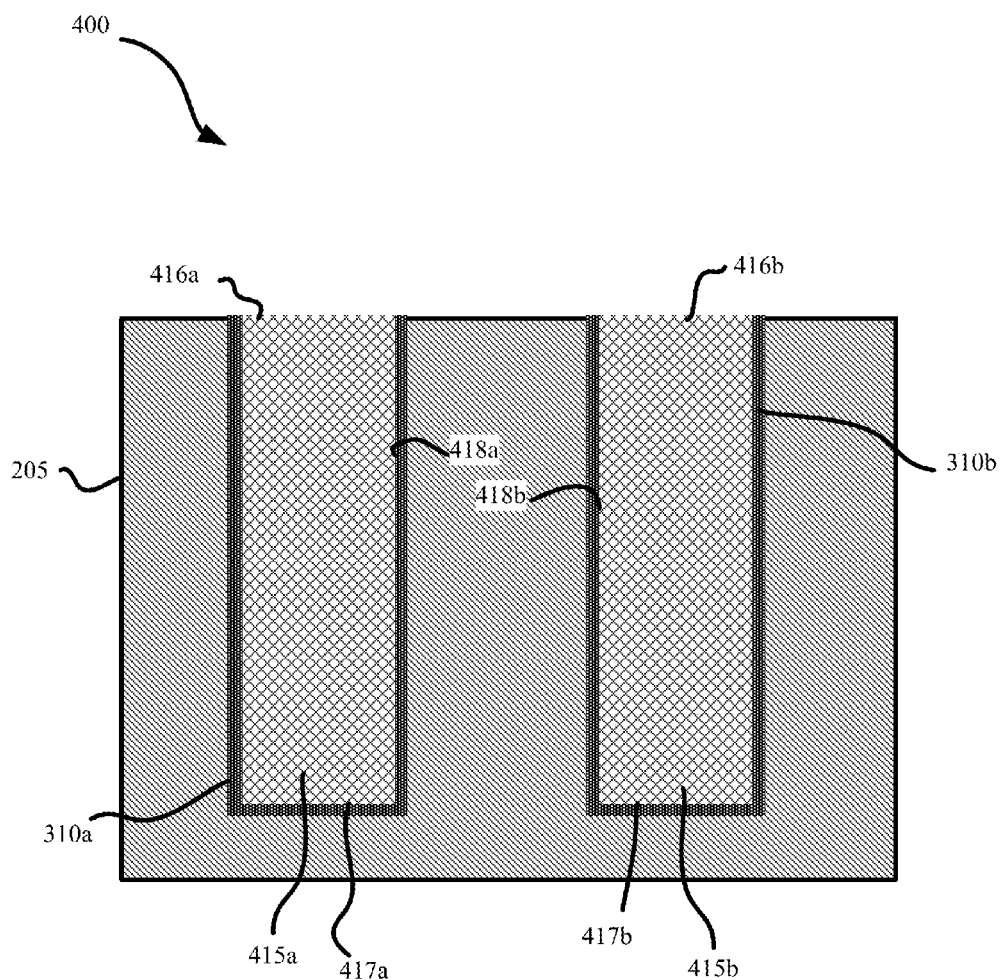

Referring now to FIG. 4, a vertical cross-sectional view of the semiconductor structure 300 of FIG. 3 is illustrated, according to an embodiment. The etched openings 306a and 306b (FIG. 3) may be filled with a conductive material forming a first TSV 415a and a second TSV 415b. The TSV conductive material may be tungsten (W), or it may be any suitable conductive material, such as, but not limited to: Ti, Cu, Ta, or Al. Also, in one embodiment, the TSVs 415a and 415b may also include a metal compound liner such as TaN, CuN, TiN, or WN to improve adhesion or other structural and electrical properties of the TSVs 415a and 415b. Each TSV 415a and 415b may have a respective front-end surface 416a, 416b and a respective back-end surface 417a, 417b. The TSVs 415a and 415b may also have respective lateral surfaces 418a and 418b. The semiconductor structure 300 may now be referred to as semiconductor structure 400 after the manufacturing step. The front-end surfaces 416a and 416b may refer to the surfaces toward the top (frontside) of the semiconductor structure 400 while the back-end surfaces 417a and 417b may refer to the surfaces at the bottom (backside) of the semiconductor structure 400.

The first and second TSVs 415a and 415b may be insulated from the semiconductor substrate 205 by respective antifuse material 310a and 310b. The antifuse material 310 may insulate the TSVs 415a and 415b, respectively, along the lateral surfaces 418a and 418b and back-end surfaces 417a and 417b. The antifuse material 310 may form antifuses between the TSVs 415a and 415b and the semiconductor substrate 205. Two TSVs are shown for the purpose of illustrating the differences between a blown and unblown TSV; however any number of TSVs may be considered. Each TSV 415a and 415b may belong to a separate power island on the semiconductor structure 400 and there may be one or more power islands.

Figure 5:
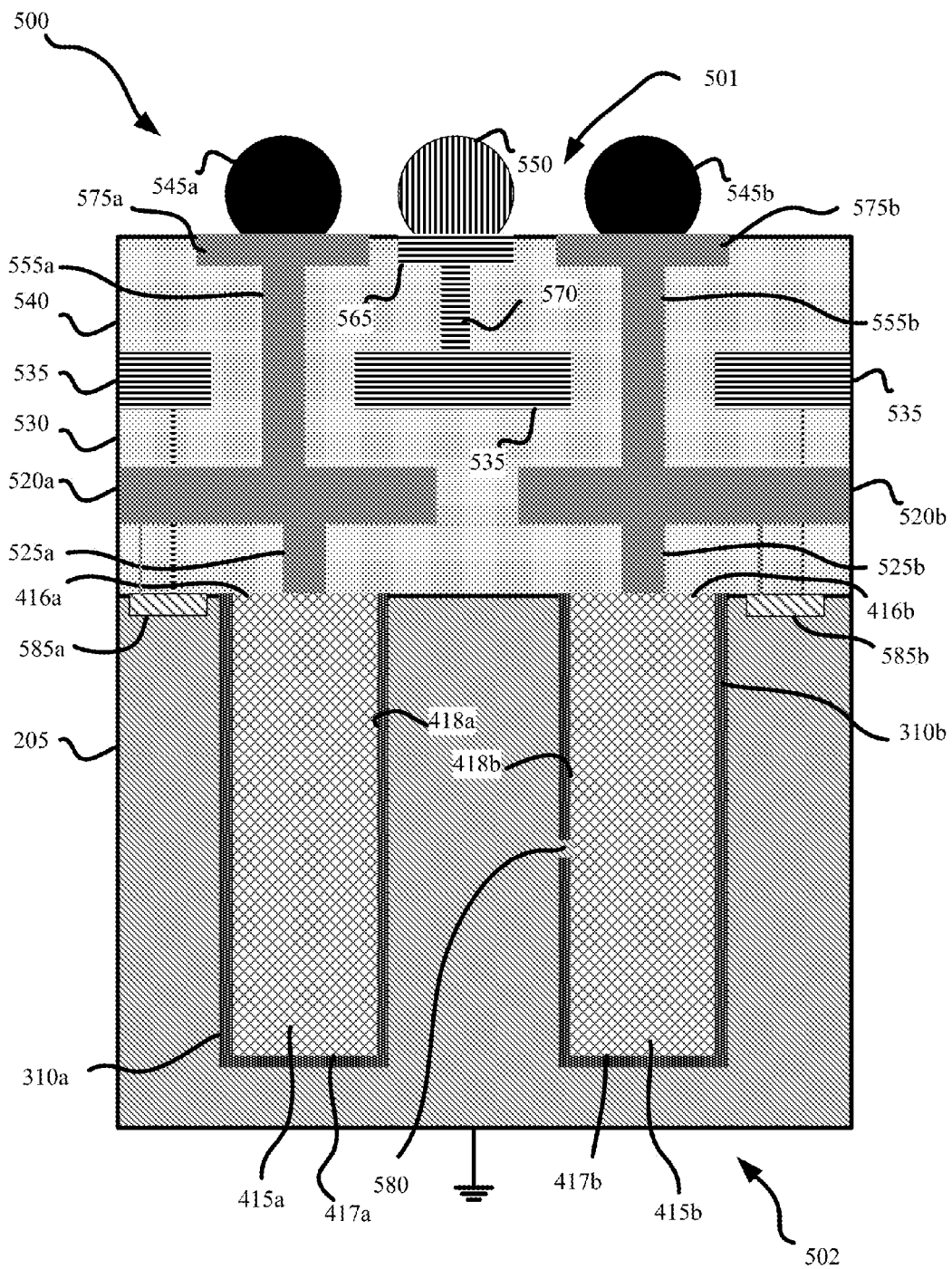

Referring now to FIG. 5, a vertical cross-sectional view of a semiconductor chip 500 is illustrated after a manufacturing step of the semiconductor structure 400 of FIG. 4, according to an embodiment. The semiconductor chip 500 may include a frontside 501 and a backside 502 referring to the area on the top and bottom of the illustrated semiconductor chip 500, respectively. The semiconductor chip 500 may include the bulk semiconductor substrate 205 coupled to ground at the backside 202 of the semiconductor chip 500.

TSV 415a and TSV 415b may be coupled to a respective first functional ground layer 520a and a second functional ground layer 520b by one or more respective first power conducting vias 525a and one or more second power conducting vias 525b. An additional power conducting via 555a may connect the functional ground layer 520a to the top levels of the semiconductor chip 500 and to a solder bump pad 575a. Similarly, power conducting via 555b may connect the functional ground layer 520b to the top levels of the semiconductor chip 500 and to a solder bump pad 575b. Solder bumps 545a and 545b may be coupled to the solder bump pad 575a and 575b, respectively.

A first insulator layer 530 may electrically isolate the functional ground layers 520a and 520b from the substrate 205 and a power supply layer (Vdd layer) 535. The Vdd layer 535 may be isolated on top by a second insulator layer 540. The first and second insulator layers 530 and 540 may be made of a dielectric such as an oxide. An oxide used may be $SiO_2$ or $HfO_2$, for example. Although not represented as being continuous in FIG. 5 for simplicity, the Vdd layer 535 may be in electrical communication throughout the various power islands. Also, in various embodiments multiple metal layers may exist above the Vdd layer 535 up to the frontside 501 of the semiconductor chip 500.

Furthermore, one or more transistors and functional circuits, referenced as 585a and 585b may be formed on the surface of the semiconductor substrate 205 closest to the frontside 501 of the semiconductor chip 500. The functional ground layers 520a and 520b and Vdd layer 535 may be electrically coupled to the functional circuits 585a and 585b. The functional circuits 585a and 585b may be electrically isolated from the semiconductor substrate 205.

In one embodiment, one or more power conducting vias 570 may connect the Vdd layer 535 to a solder bump pad 565 at the top of the semiconductor chip 500. The solder bump pad 565 may be coupled to a solder bump 550.

Metal layers including the functional ground layers 520a and 520b, the power conducting vias 525a, 525b, 555a, 555b, and 570, the Vdd layer 535, and the solder bump pads 565, 575a and 575b may all be made of a conductive material such as polysilicon suitably doped as a conductor. If metal layers are polysilicon, then the polysilicon may be silicided (e.g., titanium silicide) to enhance conductivity. However, various other materials may be substituted. Some non-limiting examples of these materials include: tungsten, titanium, tantalum, copper, silicon nitride, silicides such as cobalt or nickel silicides, germanium, silicon germanium, other metals, and various combinations of the foregoing. Furthermore, a metal layer may be made of the same material as the other metal layers in the semiconductor chip 500 or each metal layer may be unique from the other metal layers or a combination of similar and unique metals.

The solder bumps 545a, 545b, and 550 may be made of a conductive material that may be easily flowed for connection, such as solder or a lead-free bump material such as a tin-silver-copper (SAC) alloy by a plating process. The solder bumps 545a and 545b for the functional ground layers 525a and 525b, respectively, and the solder bump 550 for the Vdd layer 535 may be designed specifically for the layers to which they couple. The additional components described in FIG. 5 that are added to the semiconductor structure 400 of FIG. 4 may be added according to known manufacturing steps.

Functionally, the semiconductor device 500 may be power gated i.e., selectively provided with power, at first and second power islands that include TSV 415a and TSV 415b, respectively. Power gating the power island having the TSV 415b may be accomplished by testing the functional circuits of the TSV 415b power island during a wafer final test (WFT) with a probe pin coming in electrical communication with the solder bump 545b. The test may drive the functional ground layer 520b to ground to test the functions of the functional circuits in the power island. If the functional circuit 585b passes the test, the same pin may be used to blow the antifuse material 310b of TSV 415b by providing a program voltage to the antifuse material 310b. On the other hand, if the functional circuit 585b fails the WFT, then the antifuse material 310 may not be blown as is the case, in this example, with antifuse material 310a. Not blowing the antifuse material 310 may leave the power island "off" by not supplying power to it and the functional circuit 585b on the power island.

In other embodiments, blowing the TSVs 415a and 415b may be completed by a logic circuit within the semiconductor chip 500 and may not need to be done during WFT.

Blowing the antifuse material 310b may permanently couple the functional ground layer 520b to the grounded semiconductor substrate 205. To blow the antifuse material 310b, a relatively high voltage differential may need to be created between the TSV 415b and the grounded semiconductor substrate 205 to break down a portion of the antifuse material 310b from a conducting area 580. In this example, conducting area 580 may be the area where the antifuse material 310b has broken down due to a voltage pulse to make a conductive connection between the TSV 415b and the grounded semiconductor substrate 205. The semiconductor substrate 205 may need to be conductive enough to electrically couple the functional ground layer 520b to the substrate ground. A high concentration of p-type dopant (p+) may be needed. Concentrations of p+ dopant may range from $10^{18}$ $cm^{-3}$ to $10^{21}$ $cm^{-3}$, for example.

In one example, a 3V differential may be used as a program voltage to blow the antifuse material 310b. The wafer test pin may drive the functional ground area 520b to 3V after wafer testing. A 3V bias across the functional circuits 585 may damage them. For this reason, the Vdd layer 535 may be driven to 1.5V by a wafer pin for the solder bump 550. Increasing the Vdd layer 535 to 1.5V, while blowing the antifuse material 310b at 3V, may prevent damage to the functional circuits in the semiconductor chip 500. Both Vdd and ground may be brought up to 1.5V together. The ground layer 520b may continue to be ramped up to 3V after Vdd has reached 1.5V. The antifuse material 310b blow may be accomplished over large time intervals if the blow process requires it. Furthermore, the connection between the grounded semiconductor substrate 205 and the functional ground layer 520b may improve over time after the initial blow as more and more antifuse material 310b is broken down and migrates away from the conducting area 580. The TSV 415b may be able to handle up to about 2 amperes of current when blown.

Figure 6:
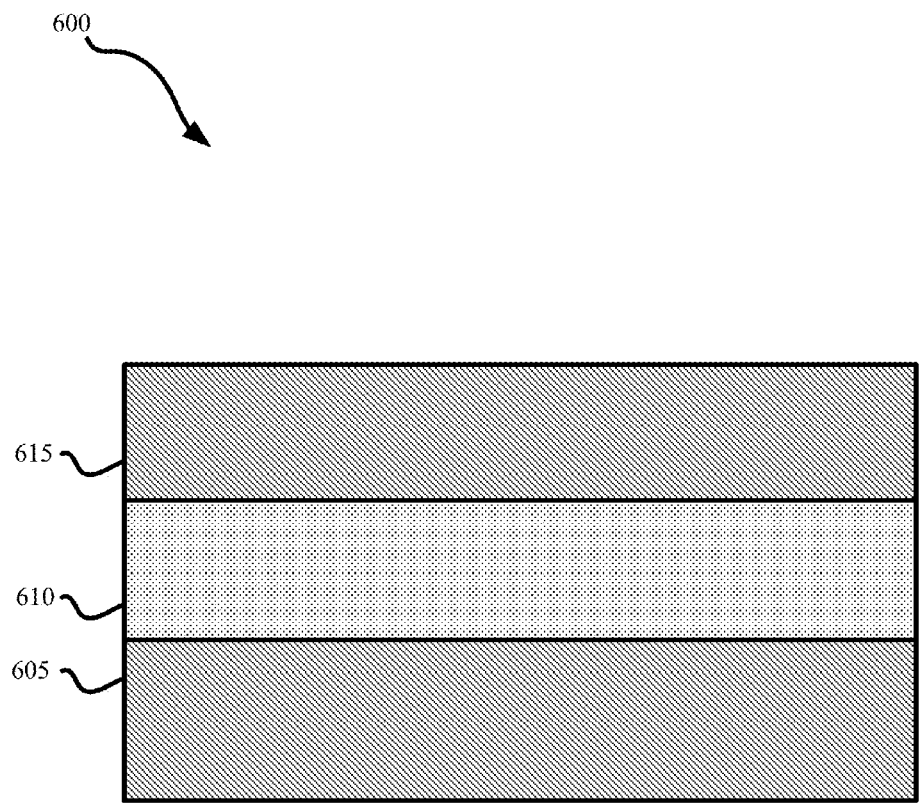
FIGS. 6-13 are sequential vertical cross-sectional views of manufacturing steps of a semiconductor chip with a semiconductor on insulator structure, according to an embodiment.

Referring now to FIG. 6, a cross-sectional view of a semiconductor structure 600 is illustrated, according to an embodiment. The semiconductor structure 600 may be a semiconductor on insulator structure. In one embodiment, the semiconductor structure 600 may be a silicon on insulator (SOI) structure. The semiconductor structure 600 may have an insulator, referred herein as a buried oxide layer 610 between a semiconductor substrate 605 at the base and a semiconductor layer 615 on top of the buried oxide layer 610. The semiconductor substrate 605 and the semiconductor layer 615 may be single crystal silicon. However, the semiconductor substrate 605 and the semiconductor layer 615 may include other appropriate semiconducting materials, including, but not limited to, SiC, Ge alloys, GaP, InAs, InP, SiGe, GaAs, other III/V or II-VI compound semiconductors, or other crystalline structures. The buried oxide layer 610 may be $SiO_2$, for example.

Figure 7:
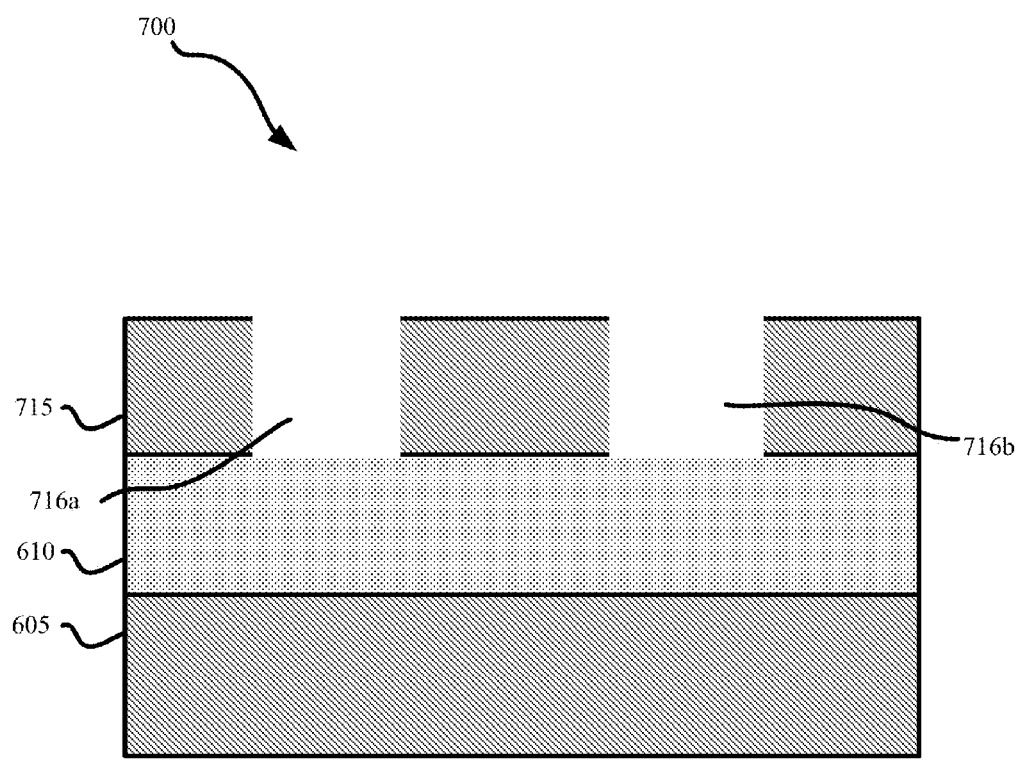

Referring now to FIG. 7, a cross-sectional view after a manufacturing step of the semiconductor structure 600 of FIG. 6 is illustrated, according to an embodiment. The semiconductor structure 600 may be selectively etched at the semiconductor layer 615 to form etched openings 716a and 716b. Two etched openings are for illustrating a blown and unblown antifuse and therefore should not be considered limiting. The semiconductor structure 600 of FIG. 6 is now referred to as semiconductor structure 700 after the manufacturing step.

Figure 8:
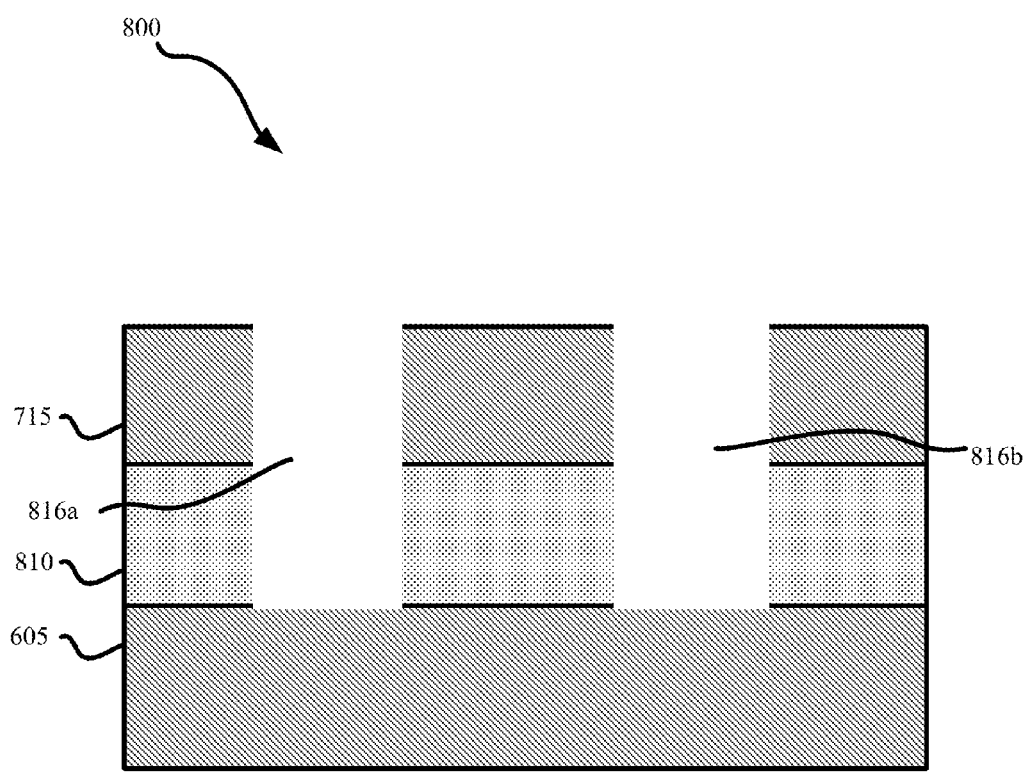

Referring now to FIG. 8, a cross-sectional view after a manufacturing step of the semiconductor structure 700 of FIG. 7 is illustrated, according to an embodiment. The semiconductor structure 700 may be selectively etched at the buried oxide layer 610 to extend etched openings 716a and 716b through the buried oxide layer to expose the surface of the semiconductor substrate 605. The extended etched openings 716a and 716b are now referred to as etched openings 816a and 816b. The semiconductor structure 700 of FIG. 7 is now referred to as semiconductor structure 800 after the manufacturing step.

Figure 9:
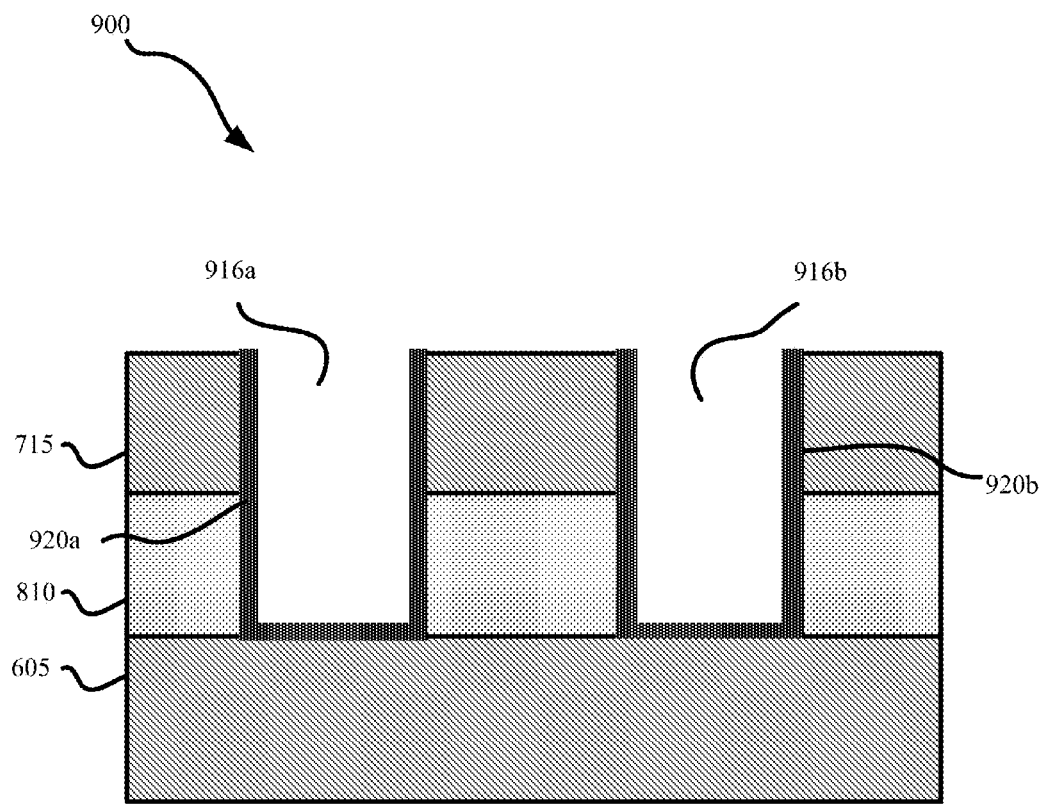

Referring now to FIG. 9, a cross-sectional view after a manufacturing step of the semiconductor structure 800 of FIG. 8 is illustrated, according to an embodiment. A steam oxidation process may occur to build up a thick layer of insulator 920a and 920b, such as $HfO_2$ or $SiO_2$, along the exposed surfaces of etched openings 816a and 816b (FIG. 8) forming etched openings 916a and 916b. The semiconductor structure 800 of FIG. 8 is now referred to as semiconductor structure 900 after the manufacturing step.

Figure 10:
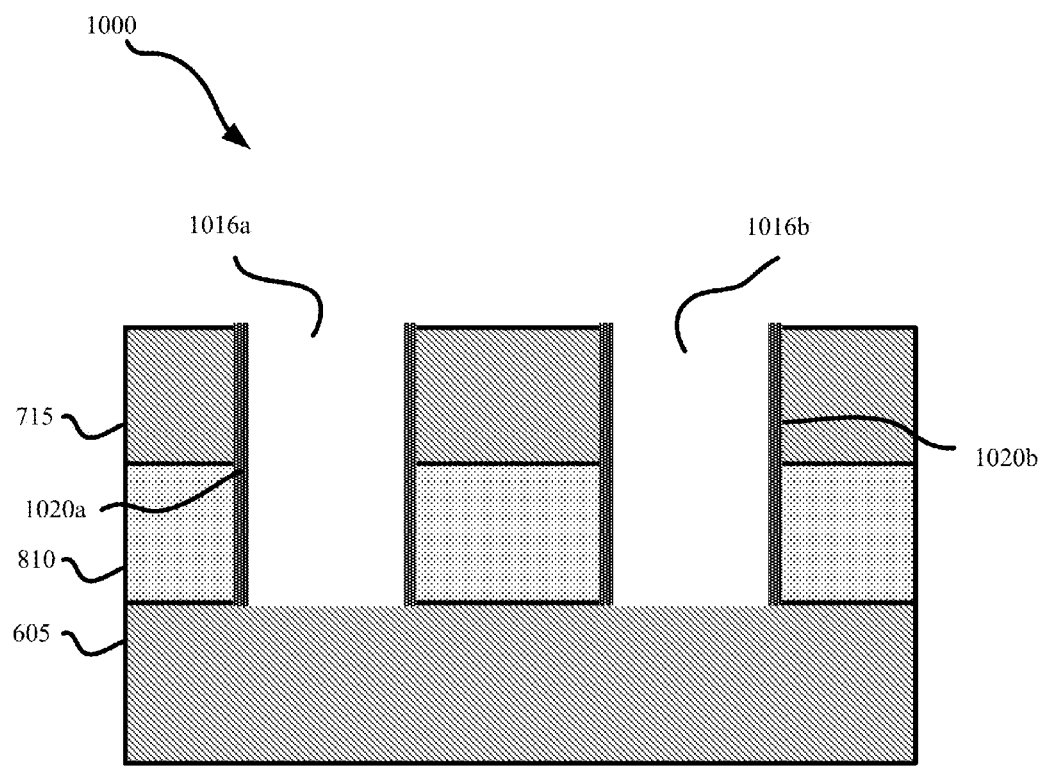

Referring now to FIG. 10, a cross-sectional view after a manufacturing step of the semiconductor structure 900 of FIG. 9 is illustrated, according to an embodiment. A reactive ion etch may be performed to etch away the insulator 920a and 920b (FIG. 9) that is in contact with the semiconductor substrate 605, exposing the semiconductor substrate 605. The etched insulator 920a and 920b are now referred to as insulator 1020a and 1020b. The etched openings 916a and 916b (FIG. 9) are now referred to as etched openings 1016a and 1016*b*. Also, semiconductor structure 900 is now referred to as semiconductor structure 1000 after the manufacturing step.

Figure 11:
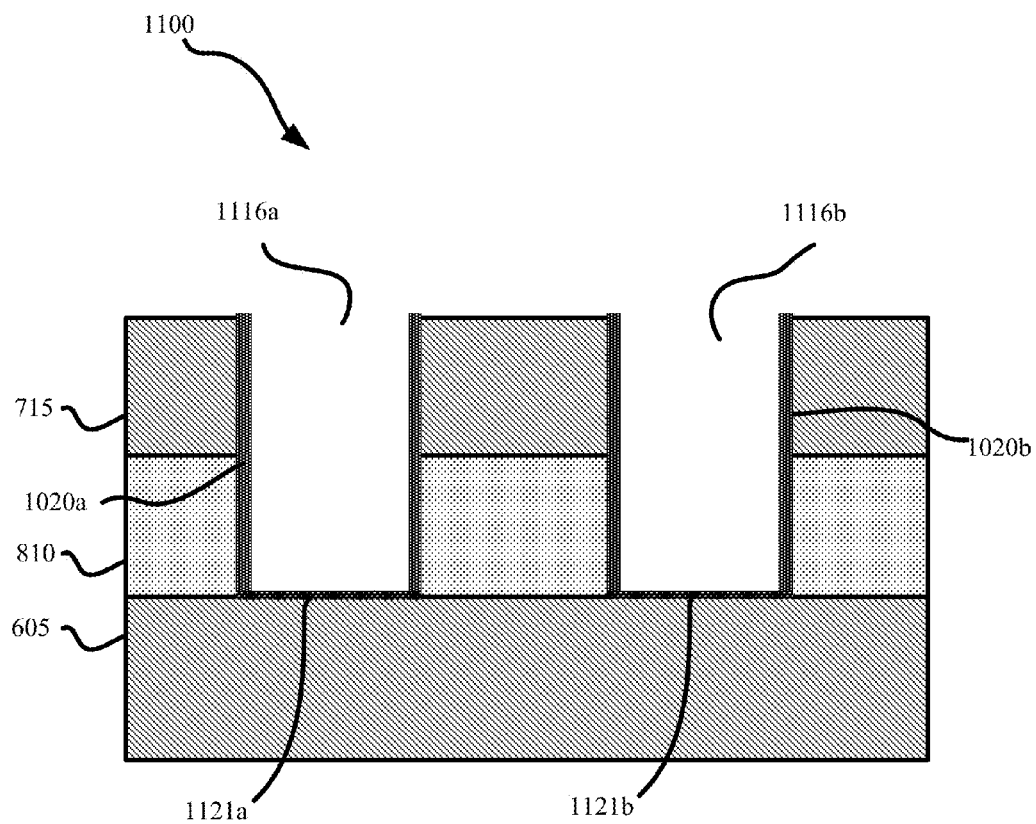

Referring now to FIG. 11, a cross-sectional view after a manufacturing step of the semiconductor structure 1000 of FIG. 10 is illustrated, according to an embodiment. A controlled oxide growth may be performed on the surface of the semiconductor substrate forming antifuse material 1121*a* and 1121*b*. The thickness of the antifuse materials 1121*a* and 1121*b* may be individually tuned to blow when a program voltage is applied to them. The thickness of the antifuse material 1121*a* and 1121*b* may be 12-15 Å, for example. The thickness of the antifuse material 1121*a* and 1121*b* may be different than the insulator 1020*a* and 1020*b* along lateral surfaces of the etched openings 1116*a* and 1116*b* so that the insulator 1020*a* and 1020*b* does not blow when a program voltage is applied, in one embodiment. This may prevent shorting between a TSV 1225 (FIG. 12) and the semiconductor layer 715 when blowing of the antifuse material 1121*a* and 1121*b*. In another embodiment, other insulation techniques besides the thickness of the insulators 1020*a* and 1020*b*, such as material type, may be contemplated to insulate the semiconductor layer 715. The antifuse material 1121*a* and 1121*b* may be any suitable material that may behave as an antifuse when a suitable voltage differential is placed across it. An antifuse material 1121*a* and 1121*b* may be $HfO_2$, for example. Semiconductor structure 1000 is now referred to as semiconductor structure 1100 after the manufacturing step.

Figure 12:
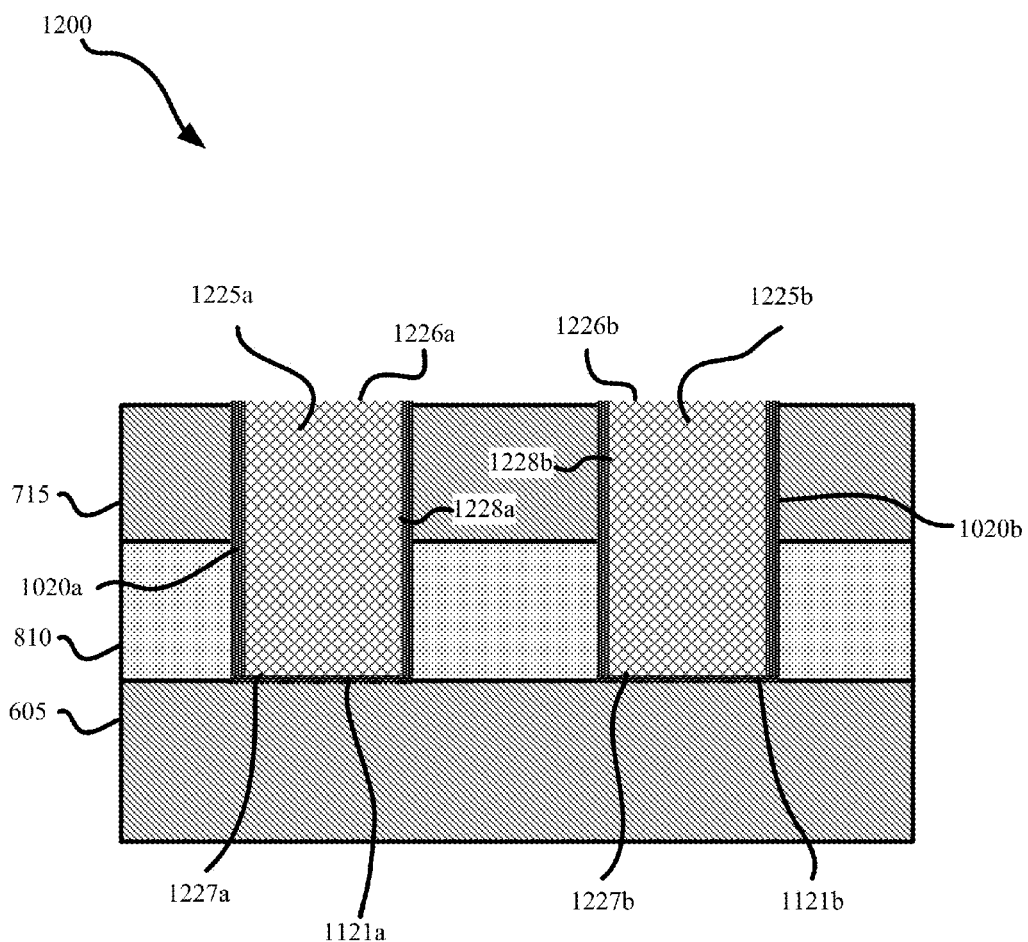

Referring now to FIG. 12, a cross-sectional view after a manufacturing step of the semiconductor structure 1100 of FIG. 11 is illustrated, according to an embodiment. A conductive material may fill in the etched openings 1116*a* and 1116*b* forming TSVs 1225*a* and 1225*b*. The TSV conductive material may be Tungsten (W) or it may be any suitable conductive material such as, but not limited to: Ti, Cu, Ta, or Al. In one embodiment, the TSVs 1225*a* and 1225*b* may also include a metal compound liner such as TaN, CuN, TiN, or WN to improve adhesion or other structural and electrical properties of the TSVs 1225*a* and 1225*b*. Each TSV 1225*a* and 1225*b* may have a respective front-end surface 1226*a* and 1226*b* and a back-end surface 1227*a* and 1227*b*. Each TSV 1225*a* and 1225*b* may have a respective lateral surface 1228*a* and 1228*b*. Semiconductor structure 1100 (FIG. 11) may now be referred as semiconductor structure 1200 after the manufacturing step.

Figure 13:
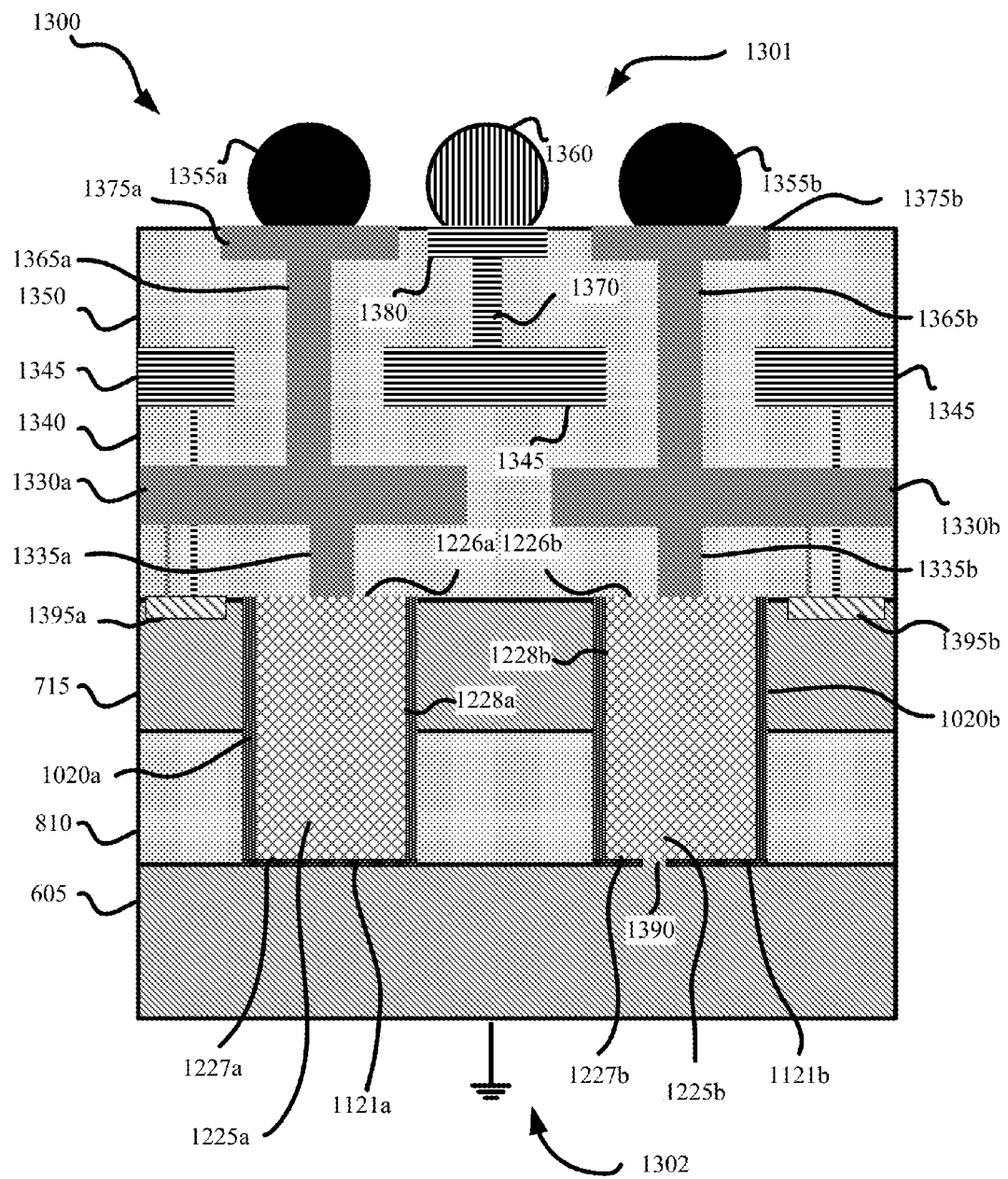

Referring now to FIG. 13, a cross-sectional view after a manufacturing step of the semiconductor structure 1200 of FIG. 12 is illustrated, according to an embodiment. After the manufacturing step, the semiconductor structure 1200 is now referred to as semiconductor chip 1300. The semiconductor chip 1300 may include a frontside 1301 and a backside 1302 referring to the area on the top and bottom of the illustrated semiconductor chip 1300, respectively. The semiconductor chip 1300 may include the semiconductor substrate 605 coupled to ground at the backside 1302 of the semiconductor chip 1300.

Each TSV 1225*a* and 1225*b* may belong to separate power islands. The TSVs 1225*a* and 1225*b* may be coupled to a respective first functional ground layer 1330*a* and a second functional ground layer 1330*b* by one or more respective first power conducting vias 1335*a* and one or more second power conducting vias 1335*b*. An additional power conducting via 1365*a* may connect the functional ground layer 1330*a* to the top levels of the semiconductor chip 1300 and to a solder bump pad 1375*a*. Similarly, power conducting via 1365*b* may connect the functional ground layer 1330*b* to the top levels of the semiconductor chip 1300 and to a solder bump pad 1375*b*. Solder bumps 1355*a* and 1355*b* may be coupled to the solder bump pad 1375*a* and 1375*b*, respectively.

A first insulator layer 1340 may electrically isolate the functional ground layers 1330*a* and 1330*b* from the semiconductor layer 715 and a power supply layer (Vdd layer) 1345. The Vdd layer 1345 may be isolated on top by a second insulator layer 1350. The first and second insulator layers 1340 and 1350 may be made of a dielectric such as an oxide. An oxide used may be $SiO_2$ or $HfO_2$, for example. Although not represented as being continuous in FIG. 13 for simplicity, the Vdd layer 1345 may be in electrical communication throughout the various power islands. Also, in various embodiments multiple metal layers may exist above the Vdd layer 1345 up to the frontside 1301 of the semiconductor chip 1300.

In one embodiment, one or more functional circuits 1395*a* and 1395*b* may be formed in the surface of the semiconductor layer 715 closest to the frontside 1301 of the semiconductor chip 1300. The functional ground layers 1330*a* and 1330*b* and Vdd layer 1345 may be electrically coupled to the functional circuits 1395*a* and 1395*b*. The functional circuits 1395*a* and 1395*b* may be electrically isolated from the semiconductor substrate 605.

In one embodiment, one or more power conducting vias 1370 may connect the Vdd layer 1345 to a solder bump pad 1380 at the frontside 1301 of the semiconductor chip 1300. The solder bump pad 1380 may be coupled to a solder bump 1360.

In one embodiment, metal layers including the functional ground layers 1330*a* and 1330*b*, the power conducting vias 1335*a*, 1335*b*, 1365*a*, 1365*b*, and 1370, the Vdd layer 1345, and the solder bump pads 1375*a*, 1375*b*, 1380 may all be made of a conductive material such as polysilicon suitably doped as a conductor. If metal layers are polysilicon, then the polysilicon may be silicided (e.g., titanium silicide) to enhance conductivity. However, various other materials may be substituted. Some non-limiting examples of these materials include: tungsten, titanium, tantalum, copper, silicon nitride, silicides such as cobalt or nickel silicides, germanium, silicon germanium, other metals, and various combinations of the foregoing. Furthermore, a metal layer may be made of the same material as the other metal layers in the semiconductor chip 1300 or each metal layer may be unique from the other metal layers or a combination of similar and unique metals.

The solder bumps 1355*a*, 1355*b*, and 1360 may be made of a conductive material that may be easily flowed for connection, such as solder or a lead-free bump material such as a tin-silver-copper (SAC) alloy by a plating process. The solder bumps 1355*a* and 1355*b* for the functional ground layers 1335*a* and 1335*b*, respectively, and the solder bumps 1360 for the Vdd layer 1345 may be designed specifically for the layers to which they couple. The additional components described according to FIG. 13 that are added to the semiconductor structure 1200 of FIG. 12 may be added according to known manufacturing steps.

Functionally, the semiconductor chip 1300 may be power gated at first and second power islands that include TSV 1225*a* and TSV 1225*b*. Power gating the power island having the TSV 1225*b* may be accomplished by testing the functional circuits of the TSV 1225*b* power island during a wafer final test (WFT) with a pin coming in electrical communication with the solder bump 1355*b*. The WFT may drive the functional ground layer 1330*b* to ground to test the functions of the functional circuits 1395*b* in the power island. If the functional circuit 1395*b* passes the test, the same pin may be used to blow the antifuse material 1121*b* of TSV 1225*b* with the program voltage. On the other hand, if the functional circuit 1395*b* fails the WFT, then the antifuse material 1121*b* may not be blown with the program voltage. Not blowing the antifuse material 1121*b* may keep the power island in which the TSV 1225*b* is located so that the functional circuit 1395*b* on the power island does not receive power. In other embodiments, blowing the TSVs 1225*a* and 1225*b* of the power islands may be completed by a logic circuit within the semiconductor chip 1300 and may not need to be done during WFT.

Blowing the antifuse material 1121*b* may permanently couple the functional ground layer 1330*b* to the grounded semiconductor substrate 605. To blow the antifuse material 1121*b*, a relatively high voltage differential may be needed to be created between the TSV 1225*b* and the grounded semiconductor substrate 605 to break down a portion of the antifuse material 1121*b*, forming a conducting area 1390. In this example, conducting area 1390 is the area where the antifuse material 1121*b* is broken down making a conductive connection between the TSV 1225*b* and the grounded semiconductor substrate 605. The semiconductor substrate 605 may need to be conductive enough to electrically couple the functional ground layer 1330*b* to the substrate ground. A high concentration of p-type dopant (p+) may be needed. Concentrations of a p+ dopant may be from $10^{18}$ cm$^{-3}$ to $10^{21}$ cm$^{-3}$, for example.

In one example of blowing antifuse material 1121*b*, a 3V differential may be used as the program voltage to blow the antifuse oxide 1121*b*. The wafer test pin may drive the functional ground area 1330*b* to 3V after WFT or by a blow logic circuit. A 3V bias across the functional circuit 1395*b* of the semiconductor chip 1300 may damage it. For this reason, the Vdd layer 1345 may be driven to 1.5V by a wafer pin for the solder bump 1355. Increasing the Vdd layer 1345 to 1.5V, while blowing the antifuse material 1121*b* at 3V, may prevent damage to the functional circuit 1395*b* in the semiconductor chip 1300. Both Vdd layer 1345 and ground layer 1330 may be brought up to 1.5V together. The ground layer 1330*b* may continue ramping up to 3V. The antifuse material 1121*b* blow may be accomplished over large time intervals if the blow process requires it. Furthermore, the connection between the grounded semiconductor substrate 605 and the functional ground layer 1330*b* may improve even more over time after the initial blow as more and more antifuse material 1121*b* breaks down and migrates away from the conducting area 1390. The TSV 1225*b* may be able to handle up to about 2 amperes of current when blown.

Figure 14:
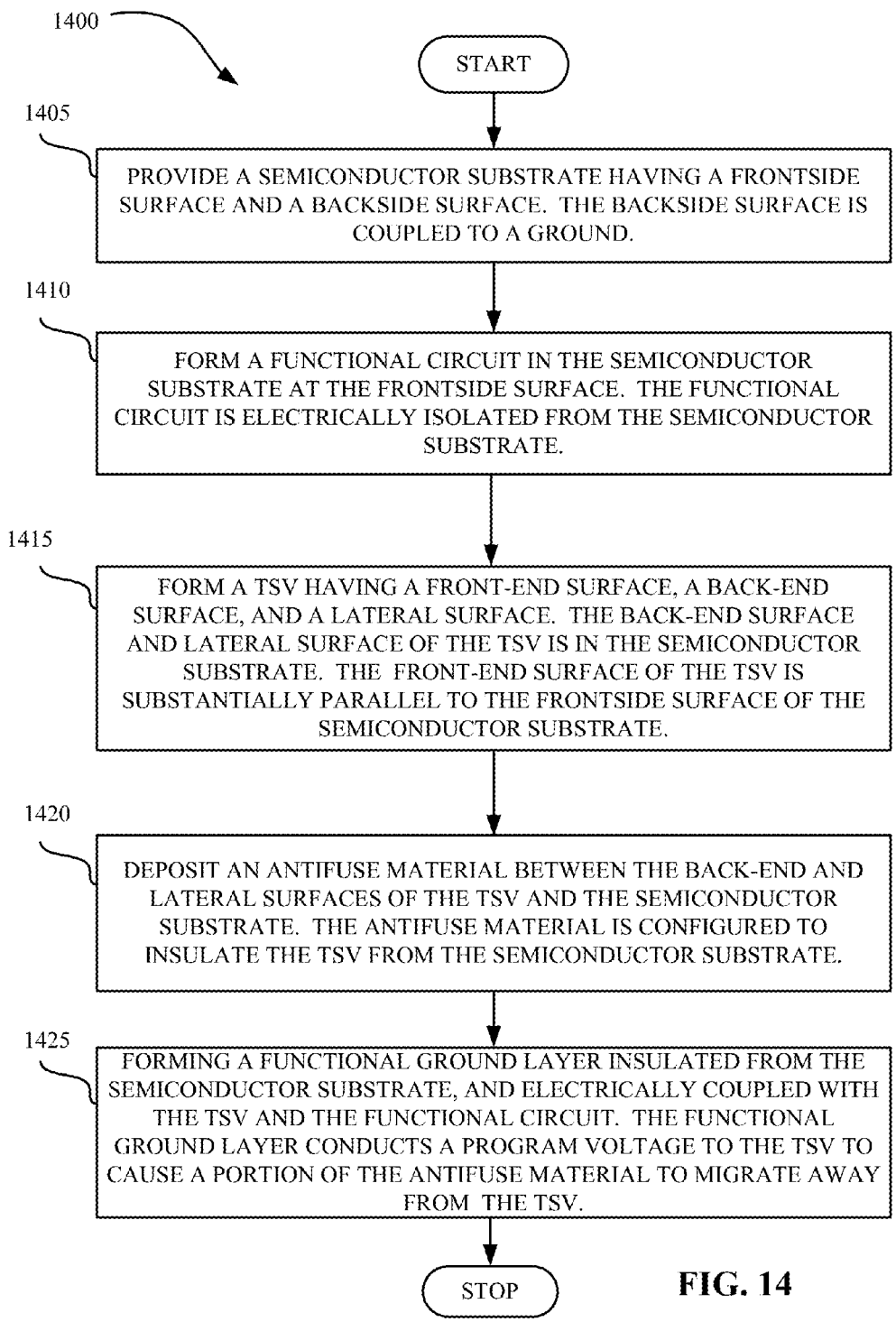
FIG. 14 is a flowchart of a method of making a semiconductor chip with a bulk semiconductor structure, according to an embodiment.

Referring now to FIG. 14, a method 1400 of making a semiconductor chip having a programmable TSV is illustrated in a flowchart, according to an embodiment. In operation 1405, a semiconductor substrate may be provided that has a frontside surface and a backside surface. The backside surface is coupled to a ground. The semiconductor substrate may be a bulk semiconductor substrate. In operation 1410, a functional circuit in the semiconductor substrate at the frontside surface may be formed. The functional circuit may be electrically isolated from the semiconductor substrate. In operation 1415, a TSV having a front-end surface, a back-end surface, and a lateral surface may be formed. The back-end surface and lateral surface of the TSV is in the semiconductor substrate. The front-end surface of the TSV is substantially parallel to the frontside surface of the semiconductor substrate. In operation 1420, an antifuse material may be deposited between the back-end and lateral surfaces of the TSV and the semiconductor substrate. The antifuse material is configured to insulate the TSV from the semiconductor substrate. In operation 1425, a functional ground layer may be formed.

The functional ground layer is insulated from the semiconductor substrate and electrically coupled with the TSV and the functional circuit. The functional ground layer conducts a program voltage to the TSV to cause a portion of the antifuse material to migrate away from the TSV.

Figure 15:
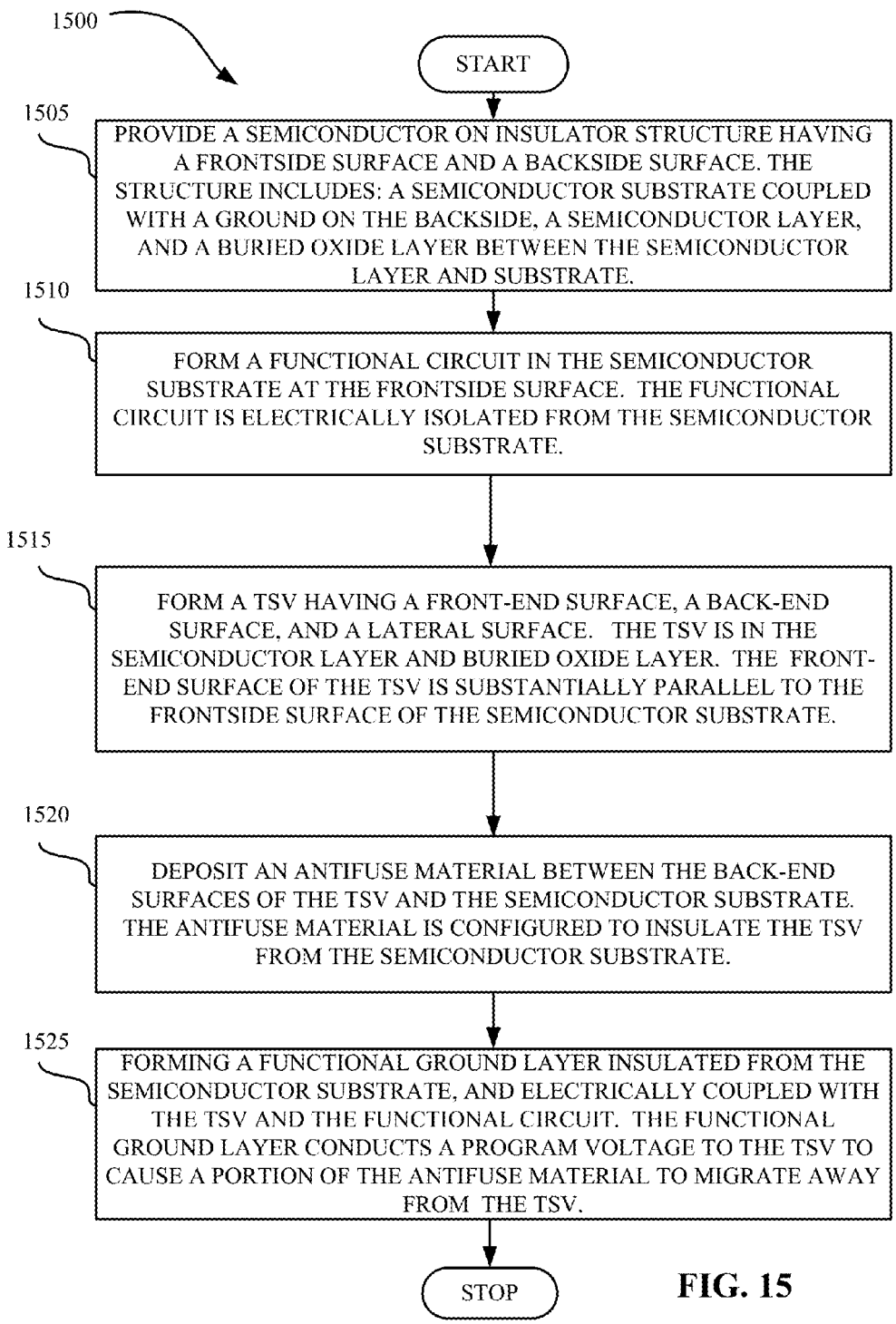
FIG. 15 is a flowchart of a method of making a semiconductor chip with a semiconductor on insulator structure, according to an embodiment.

Referring now to FIG. 15, a method 1500 of making a semiconductor chip having a programmable TSV is illustrated in a flowchart, according to an embodiment. In operation 1505, a semiconductor on insulator structure may be provided that has a frontside surface and a backside surface. The semiconductor on insulator structure may include a semiconductor substrate forming the backside surface. The backside surface is coupled to ground. The semiconductor on insulator structure may also include a semiconductor layer forming the frontside surface, and buried oxide layer between the semiconductor layer and semiconductor substrate. In operation 1510, a functional circuit in the semiconductor substrate at the frontside surface may be formed. The functional circuit may be electrically isolated from the semiconductor substrate. In operation 1515, a TSV having a front-end surface, a back-end surface, and a lateral surface may be formed. The back-end surface and lateral surface of the TSV is in the semiconductor layer and buried oxide layer. The front-end surface of the TSV is substantially parallel to the frontside surface of the semiconductor layer. In operation 1520, an antifuse material may be deposited between the back-end surface of the TSV and the semiconductor substrate. The antifuse material is configured to insulate the TSV from the semiconductor substrate. In operation 1525, a functional ground layer may be formed. The functional ground layer is insulated from the semiconductor substrate and electrically coupled with the TSV and the functional circuit. The functional ground layer conducts a program voltage to the TSV to cause a portion of the antifuse material to migrate away from the TSV.

Figure 16:
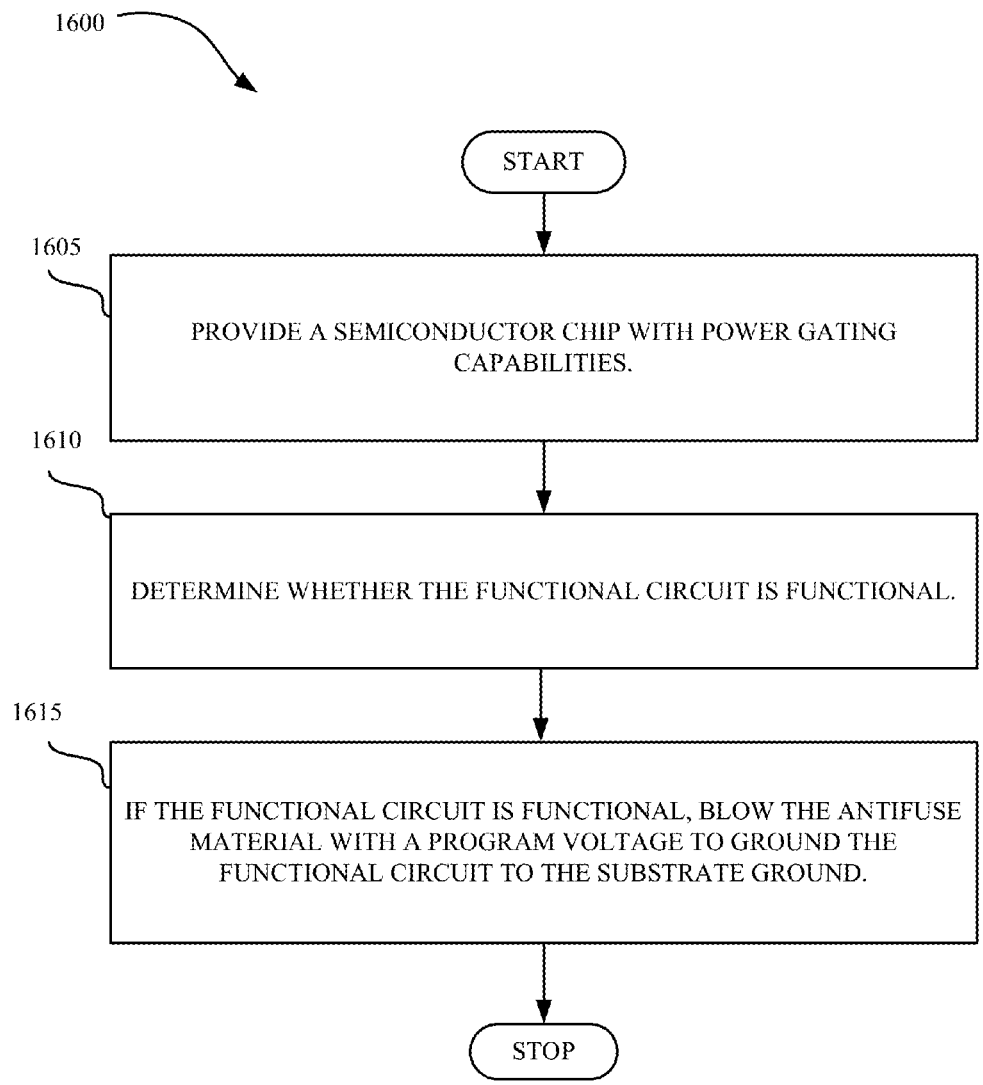
FIG. 16 is a flowchart of a method of power gating the semiconductor chips, according to an embodiment.

FIG. 16 illustrates a flowchart of a method 1600 of programming a semiconductor chip, according to an embodiment. In operation 1605, a semiconductor chip with power gating capabilities may be provided. The semiconductor chip may be the chips of any of the embodiments described herein, i.e., either a semiconductor on insulator chip or a bulk semiconductor chip. In operation 1610, the semiconductor chip may be tested to determine whether the functional circuit in the chip is functioning properly. In operation 1615, if the functional circuit is functioning properly, then the antifuse material may be blown with a program voltage to ground the functional circuit to the substrate ground. The program voltage may cause a portion of the antifuse material to migrate away from the TSV, thereby electrically coupling the TSV to the substrate ground.

It should be noted that the operations of the methods described should not be limited to the sequence they are given but may accomplish the method in any given sequence.

While embodiments have been described with reference to the details of the embodiments shown in the drawings, these details are not intended to limit the scope of the embodiments in the appended claims.

What is claimed is:

1. A semiconductor chip comprising:
   a semiconductor on insulator structure having a frontside surface and a backside surface, the semiconductor on insulator structure including:
      a semiconductor substrate forming the backside surface, the backside surface coupled to a ground,
      a semiconductor layer forming the frontside surface, and
      an buried oxide layer between the semiconductor substrate and the semiconductor layer;

a functional circuit in the semiconductor layer at the frontside surface, the functional circuit electrically isolated from the semiconductor substrate;

a through silicon via (TSV) having a front-end surface, a back-end surface, and a lateral surface, the TSV being in the semiconductor layer and buried oxide layer, and the front-end surface of the TSV being substantially parallel to the frontside surface of the semiconductor layer;

an antifuse material deposited between the back-end surface of the TSV and the semiconductor substrate, the antifuse material being configured to insulate the TSV from the semiconductor substrate; and a functional ground layer insulated from the semiconductor on insulator structure, and electrically coupled with the TSV and the functional circuit, wherein the functional ground layer is configured to conduct a program voltage to the TSV to cause a portion the antifuse material to migrate away from the TSV, thereby electrically connecting the functional circuit to the ground.

2. The semiconductor chip of claim 1, further comprising:
a power supply layer configured to supply a supply voltage to the functional circuit.

3. The semiconductor chip of claim 1, further comprising:
a solder bump electrically coupled with the functional ground layer, wherein the solder bump is configured to receive one of a test voltage and the program voltage, the test voltage to test the functional circuit.

4. The semiconductor chip of claim 1, wherein the semiconductor substrate is adequately doped to electrically couple the TSV to ground when the antifuse material is blown.

5. The semiconductor chip of claim 1, wherein a conducting area formed by blowing the antifuse material between the TSV and the semiconductor substrate improves with use of semiconductor chip.

6. The semiconductor chip of claim 1, further comprising two or more power islands, wherein a first power island includes the functional circuit and the TSV.

7. The semiconductor chip of claim 1, wherein the semiconductor on insulator structure is a silicon on insulator structure.

8. A method of manufacturing semiconductor chip, comprising:
providing a semiconductor on insulator structure having a frontside surface and a backside surface, the semiconductor on insulator structure including:
a semiconductor substrate forming the backside surface, the backside surface coupled to a ground,
a semiconductor layer forming the frontside surface, and
an buried oxide layer between the semiconductor substrate and the semiconductor layer;
forming a functional circuit in the semiconductor layer at the frontside surface, the functional circuit electrically isolated from the semiconductor substrate;
forming a through silicon via (TSV) having a front-end surface, a back-end surface, and a lateral surface, the TSV being in the semiconductor layer and buried oxide layer, and the front-end surface of the TSV being substantially parallel to the frontside surface of the semiconductor layer;
depositing an antifuse material between the back-end surface of the TSV and the semiconductor substrate, the antifuse material being configured to insulate the TSV from the semiconductor substrate; and
forming a functional ground layer insulated from the semiconductor on insulator structure, and electrically coupled with the TSV and the functional circuit, wherein the functional ground layer is configured to conduct a program voltage to the TSV to cause a portion the antifuse material to migrate away from the TSV, thereby electrically connecting the functional circuit to the ground.

9. The method 8, further comprising:
forming a power supply layer configured to supply a supply voltage to the functional circuit.

10. The method of claim 8, further comprising:
electrically coupling a solder bump with the functional ground layer, wherein the solder bump is configured to receive one of a test voltage and the program voltage, the test voltage to test the functional circuit.

11. The method of claim 8, wherein the semiconductor substrate is adequately doped to electrically couple the TSV to ground when the antifuse material is blown.

12. The method of claim 8, wherein a conducting area formed by blowing the antifuse material between the TSV and the semiconductor substrate improves with use of semiconductor chip.

13. The method of claim 8, wherein the semiconductor chip includes two or more power islands, wherein a first power island includes the functional circuit and the TSV.

14. The method of claim 8, wherein the semiconductor on insulator structure is a silicon on insulator structure.

15. The method of power gating a semiconductor chip, comprising:
providing a semiconductor chip, the semiconductor chip including:
a semiconductor on insulator structure having a frontside surface and a backside surface, the semiconductor on insulator structure including:
a semiconductor substrate forming the backside surface, the backside surface coupled to a ground,
a semiconductor layer forming the frontside surface, and
an buried oxide layer between the semiconductor substrate and the semiconductor layer;
a functional circuit in the semiconductor layer at the frontside surface, the functional circuit electrically isolated from the semiconductor substrate,
a through silicon via (TSV) having a front-end surface, a back-end surface, and a lateral surface, the TSV being in the semiconductor layer and buried oxide layer, and the front-end surface of the TSV being substantially parallel to the frontside surface of the semiconductor layer,
an antifuse material deposited between the back-end surface of the TSV and the semiconductor substrate, the antifuse material being configured to insulate the TSV from the semiconductor substrate, and
a functional ground layer insulated from the semiconductor on insulator structure, and electrically coupled with the TSV and the functional circuit, wherein the functional ground layer is configured to conduct a program voltage to the TSV to cause a portion the antifuse material to migrate away from the TSV, thereby electrically connecting the functional circuit to the ground;
determining whether the functional circuit is functional;
if the functional circuit is functional, blowing the antifuse material with a program voltage to ground the functional circuit to the substrate ground.

16. The method of claim 15, wherein the semiconductor chip includes a power supply layer configured to supply a supply voltage to the functional circuit.

17. The method of claim 16, wherein blowing the antifuse material includes raising the supply voltage and the program voltage together so as not to exceed a maximum voltage differential across the functional circuit and providing a high enough program voltage to blow the antifuse material.

18. The method of claim 15, wherein determining whether the functional circuit is functional and blowing the antifuse material is done by applying a respective test voltage and a respective program voltage to a solder bump electrically coupled with the functional ground layer.

19. The method of claim 15, wherein the semiconductor substrate is adequately doped to electrically couple the TSV to ground when the antifuse material is blown.

20. The method of claim 15, wherein the semiconductor chip includes two or more power islands, wherein a first power island includes the functional circuit and the TSV.

* * * * *